(12) United States Patent
Fueldner et al.

(10) Patent No.: US 11,053,117 B2
(45) Date of Patent: Jul. 6, 2021

(54) MEMS COMPONENT AND PRODUCTION METHOD FOR A MEMS COMPONENT

(71) Applicant: Infineon Technologies AG, Neubiberg (DE)

(72) Inventors: Marc Fueldner, Neubiberg (DE); Stefan Barzen, Munich (DE); Alfons Dehe, Villingen Schwenningen (DE); Gunar Lorenz, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/821,145

(22) Filed: Mar. 17, 2020

(65) Prior Publication Data
US 2020/0216309 A1 Jul. 9, 2020

Related U.S. Application Data

(62) Division of application No. 16/041,083, filed on Jul. 20, 2018, now Pat. No. 10,689,250.

(30) Foreign Application Priority Data

Jul. 21, 2017 (DE) .......................... 102017212613.2

(51) Int. Cl.
*B81C 1/00* (2006.01)
*B81B 3/00* (2006.01)
(Continued)

(52) U.S. Cl.
CPC ........ *B81C 1/00182* (2013.01); *B81B 3/0021* (2013.01); *B81C 1/00158* (2013.01);
(Continued)

(58) Field of Classification Search
CPC ...... B81B 1/00–008; B81B 3/00–0097; B81B 5/00; B81B 7/00–04;
(Continued)

(56) References Cited

U.S. PATENT DOCUMENTS

| 2018/0091906 A1 | 3/2018 | Khenkin et al. |
| 2018/0146296 A1* | 5/2018 | Meisel ..................... H04R 9/08 |
| 2018/0234774 A1* | 8/2018 | Walther ................ B81B 3/0021 |

FOREIGN PATENT DOCUMENTS

| DE | 102009000056 A1 | 7/2010 |
| DE | 102010031659 A1 | 1/2012 |

(Continued)

*Primary Examiner* — Cuong B Nguyen
(74) *Attorney, Agent, or Firm* — Slater Matsil, LLP

(57) ABSTRACT

In accordance with one exemplary embodiment, a production method for a double-membrane MEMS component comprises the following steps: providing a layer arrangement on a carrier substrate, wherein the layer arrangement has a first and second membrane structure spaced apart from one another and a counterelectrode structure arranged therebetween, wherein a sacrificial material is arranged in an intermediate region between the counterelectrode structure and the first and second membrane structures respectively spaced apart therefrom, and wherein the first membrane structure has an opening structure to the intermediate region with the sacrificial material and partly removing the sacrificial material from the intermediate region in order to obtain a mechanical connection structure comprising the sacrificial material between the first and second membrane structures, which mechanical connection structure is mechanically coupled between the first and second membrane structures and is mechanically decoupled from the counterelectrode structure.

19 Claims, 8 Drawing Sheets

(51) Int. Cl.
*H04R 19/00* (2006.01)
*H04R 31/00* (2006.01)
*H04R 19/04* (2006.01)

(52) U.S. Cl.
CPC .... *H04R 19/005* (2013.01); *B81B 2201/0257* (2013.01); *B81B 2201/0264* (2013.01); *B81B 2203/0127* (2013.01); *B81B 2203/04* (2013.01); *B81C 2201/0109* (2013.01); *B81C 2201/0133* (2013.01); *H04R 19/04* (2013.01); *H04R 31/00* (2013.01); *H04R 2201/003* (2013.01); *H04R 2499/11* (2013.01)

(58) Field of Classification Search
CPC ........... B81B 2201/00–13; B81B 2203/00–06; B81B 2207/00–99; B81C 99/00–0095; B81C 2201/00–117; B81C 2203/00–0792; B81C 1/00523–00571; B81C 1/00841–00857
See application file for complete search history.

(56) References Cited

FOREIGN PATENT DOCUMENTS

| | | | |
|---|---|---|---|
| DE | 102014212340 A1 | 1/2015 |
| DE | 102015103059 A1 | 9/2015 |
| DE | 102015103236 A1 | 9/2015 |

\* cited by examiner

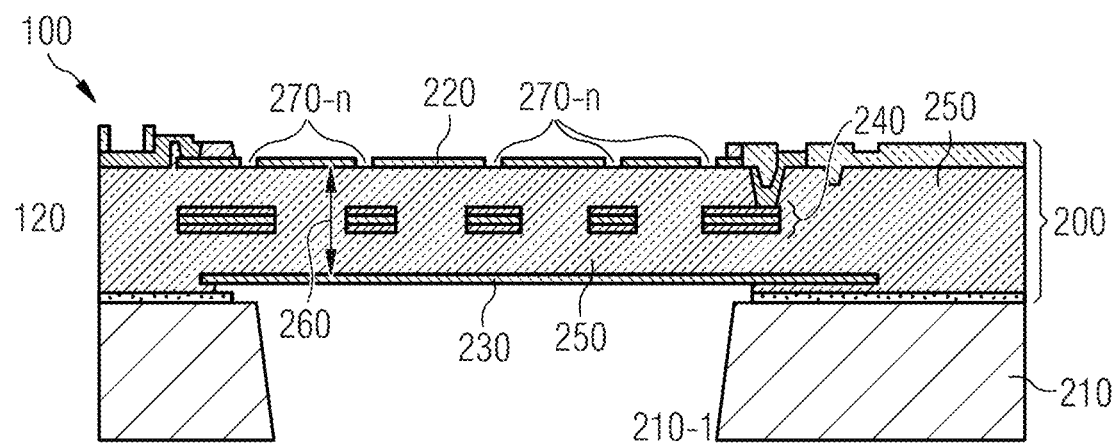
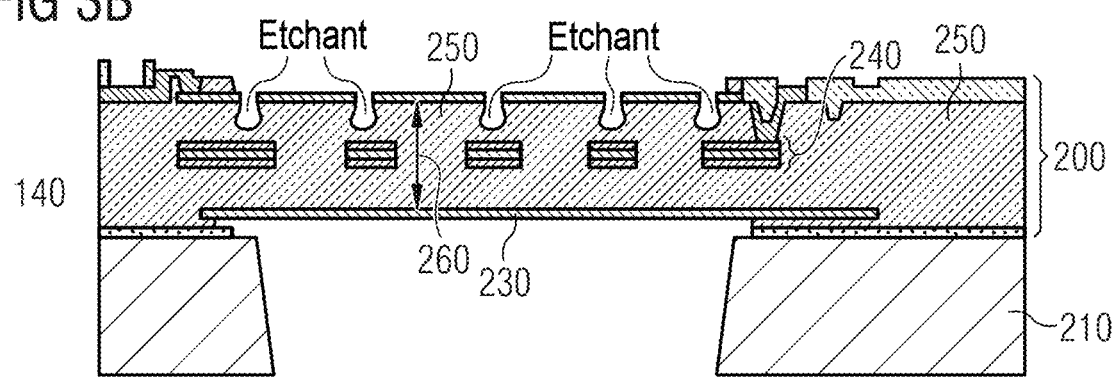
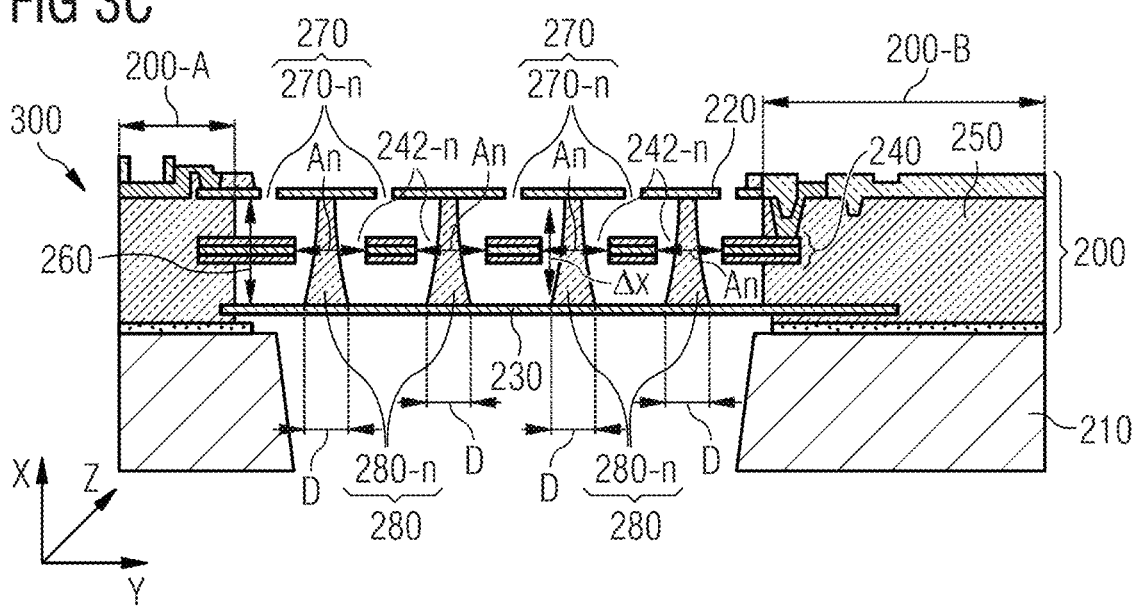

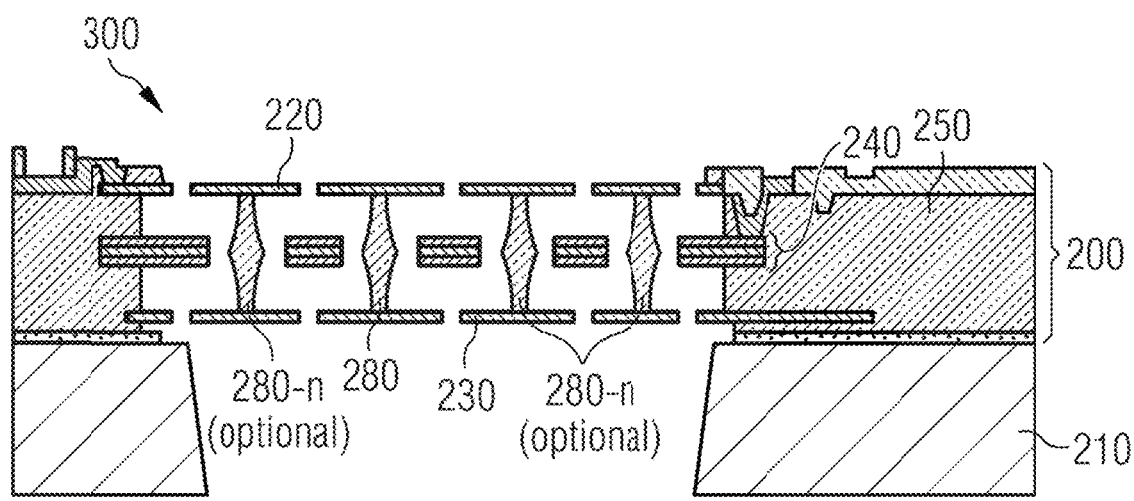

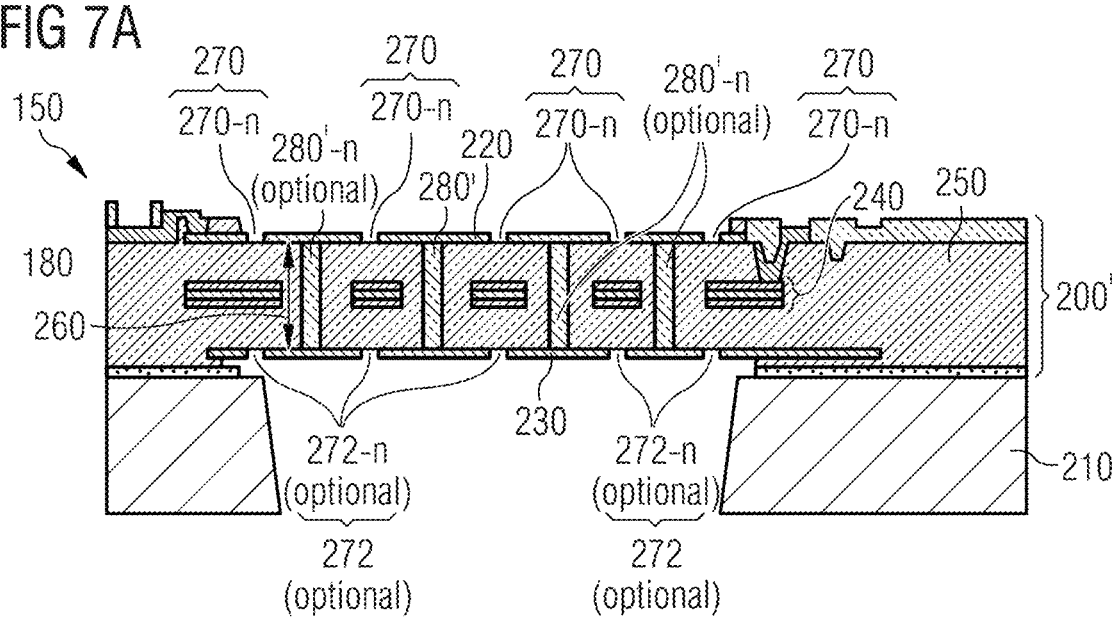
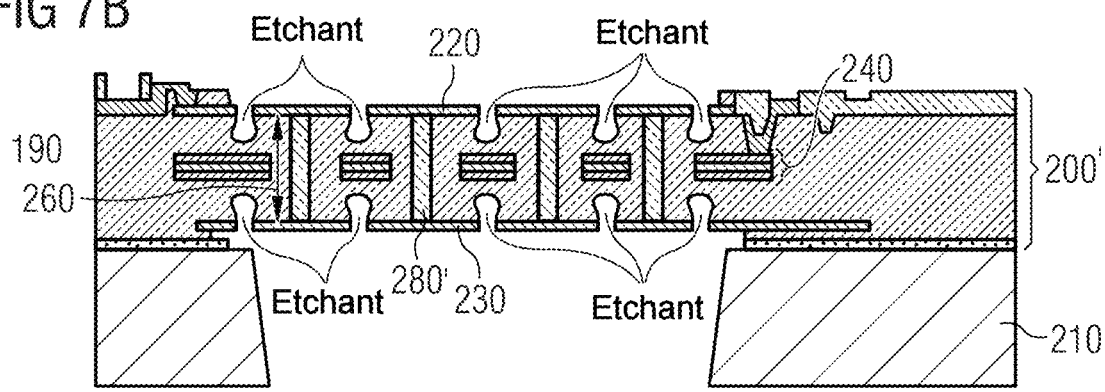
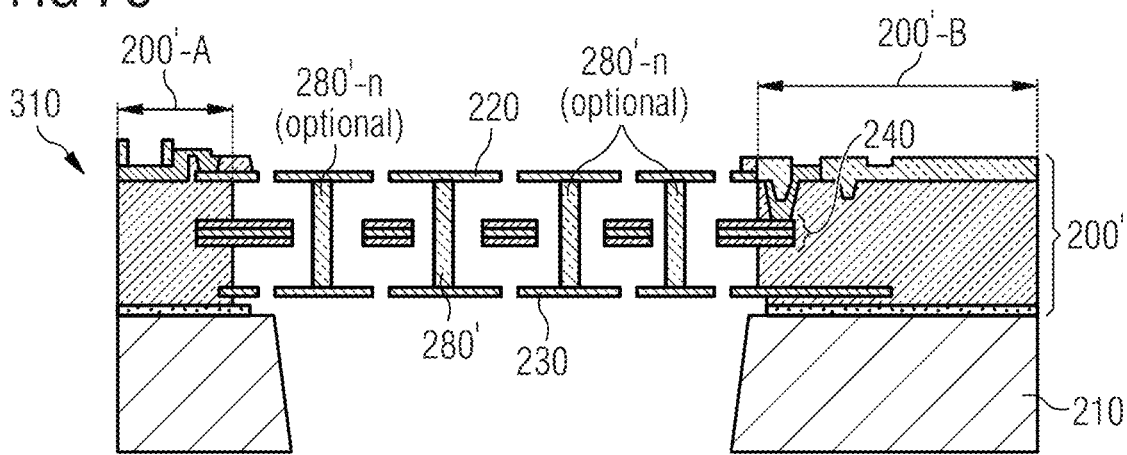

MEMS COMPONENT AND PRODUCTION METHOD FOR A MEMS COMPONENT

This application is a divisional of U.S. patent application Ser. No. 16/041,083, filed Jul. 20, 2018, which application claims the benefit of German Application No. 102017212613.2, filed on Jul. 21, 2017, which applications are hereby incorporated herein by reference in its entirety.

TECHNICAL FIELD

Exemplary embodiments relate to double-membrane MEMS components and to production methods for double-membrane MEMS components, such as e.g. MEMS pressure transducers, acoustic MEMS sensors or MEMS sound transducers in the form of MEMS microphones or MEMS loudspeakers. Exemplary embodiments relate in particular to acoustic MEMS sensors protected against ambient influences.

BACKGROUND

Acoustic MEMS sensors, such as e.g. MEMS microphones, are open components and exposed to the surrounding environment in a manner governed by their function. Therefore, such sensors are perceptible to contaminants or contaminations with organic or inorganic particles, liquids, moisture, etc., which can penetrate into the active sensor structures. This can lead to a malfunction or to a reduced performance of the sensor. Cellular phone manufacturers invest great efforts to protect the sensors within the application, such as e.g. within mobile devices, by means of complex grilles and special ports.

Furthermore, it should be noted that MEMS sensors are not protected at all during component assembly, and so possible contaminations within the production line can also cause malfunctions. Consequently, cost-intensive clean room arrangements are required in order to prevent as far as possible impairments that otherwise occur in the production yield.

As has already been discussed above, MEMS microphones are protected for example in part by mechanical protection elements, such as grilles, etc., at the component level. This is costly and often restricts product design at the end customer level.

By contrast, approaches for the design of the capacitive structure also exist at the level of the microphone components. The capacitive structure has for example a perforated back plate, a deflectable membrane and the intervening air gap, wherein for example the sensitive and active sensor capacitance, i.e. the air gap, is protected by the membrane. Depending on the desired housing design for the microphone, however, the resulting design of the microphone also has to be adapted if the desired protective effect is intended to be obtained for example depending on the positioning with respect to the sound port (sound opening). Furthermore, the MEMS microphone design is intended not to impair the acoustic behavior of the microphone, that is to say that it is desirable to obtain the highest possible signal-to-noise ratio (SNR) of the microphone output signal.

SUMMARY

In accordance with one exemplary embodiment, a production method for a double-membrane MEMS component (MEMS=microelectromechanical system) comprises the following steps: providing a layer arrangement on a carrier substrate, wherein the layer arrangement has a first and second membrane structure spaced apart from one another and a counterelectrode structure arranged therebetween, wherein a sacrificial material is arranged in an intermediate region between the counterelectrode structure and the first and second membrane structures respectively spaced apart therefrom, and wherein the first membrane structure has an opening structure to the intermediate region with the sacrificial material, and partly removing the sacrificial material from the intermediate region 20 in order to obtain a mechanical connection structure comprising the sacrificial material between the first and second membrane structures which mechanical connection structure is mechanically coupled between the first and second membrane structures and is mechanically decoupled from the counterelectrode structure.

In accordance with one exemplary embodiment, the step of partly removing is carried out by means of a process of anisotropically etching the sacrificial material.

In accordance with one exemplary embodiment, the opening structure in the first membrane structure is configured geometrically so as to obtain, during the step of partly removing the sacrificial material, a single, columnar, mechanical connection element 280 comprising the sacrificial material or a plurality of columnar, mechanical connection elements comprising the sacrificial material between the first and second membrane structures.

In accordance with one exemplary embodiment, the second membrane structure furthermore has an opening structure, wherein the opening structures in the first and second membrane structures are configured so as to obtain, during the step of partly removing the sacrificial material, a single, columnar, mechanical connection element comprising the sacrificial material or a plurality of columnar, mechanical connection elements comprising the sacrificial material between the first and second membrane structures.

In accordance with one exemplary embodiment, the opening structure in the first membrane structure or in the first and second membrane structures 220, 230 is configured so as to form the mechanical connection structure comprising the sacrificial material on the basis of the etching rate and etching selectivity of the etchant for the sacrificial material during the etching process, such that the connection structure is mechanically coupled between the first and second membrane structures and mechanically decoupled from the counterelectrode structure.

In accordance with one exemplary embodiment, the opening structure in the first and/or second membrane structure has individual openings on a circular line.

In accordance with one exemplary embodiment, the individual openings are arranged symmetrically around a geometric midpoint M of the first and/or second membrane structure.

In accordance with one exemplary embodiment, the opening structure has a multiplicity of distributed individual openings in the first and/or second membrane structure, wherein a region having a greater distance between the distributed individual openings is provided in order to predefine a position of a connection element.

In accordance with one exemplary embodiment, a plurality of regions having a greater distance between the distributed individual openings is provided in order to predefine positions for the plurality of connection elements.

In accordance with one exemplary embodiment, before the step of providing the layer arrangement the following steps are carried out: forming the second membrane structure in a patterned manner on the carrier substrate in the form of a second membrane layer or a second membrane layer stack, applying sacrificial material on the second membrane structure, forming the counterelectrode structure in a patterned manner in the form of a counterelectrode layer or a counterelectrode layer stack on the applied sacrificial material, applying sacrificial material on the counterelectrode structure, and forming 119 the first membrane structure in a patterned manner on the sacrificial material in the form of a first membrane layer or a first membrane layer stack.

In accordance with one exemplary embodiment, a production method for a double-membrane MEMS component comprises the following steps: providing a layer structure arrangement on a semiconductor substrate, wherein the layer arrangement has a first and second membrane structure spaced apart from one another and a counterelectrode structure arranged therebetween, wherein a sacrificial material is arranged in an intermediate region between the counterelectrode structure and the first and second membrane structures respectively spaced apart therefrom, wherein in the sacrificial material there is formed a mechanical connection structure having at least one columnar, mechanical connection element which is arranged between the first and second membrane structures and in a manner separated from the counterelectrode structure and comprises a filling material different than the sacrificial material, and wherein the first membrane structure has an opening structure to the intermediate region with the sacrificial material, and removing the sacrificial material from the intermediate region in order to expose the at least one columnar, mechanical connection element between the first and second membrane structures, which is mechanically coupled between the first and second membrane structures and is mechanically decoupled from the counterelectrode structure.

In accordance with one exemplary embodiment, the step of removing the sacrificial material is carried out by means of an anisotropic etching process using an etchant, wherein the etchant has an etching rate that is considerably higher for the sacrificial material than for the filling material.

In accordance with one exemplary embodiment, before the step of providing the layer arrangement the following steps are carried out: forming the second membrane structure in a patterned manner in the form of a second membrane layer or a second membrane layer stack on the carrier substrate, applying sacrificial material on the second membrane structure, forming the counterelectrode structure in a patterned manner in the form of a counterelectrode layer or a counterelectrode layer stack on the applied sacrificial material, applying sacrificial material on the counterelectrode structure, introducing at least one columnar through opening into the sacrificial material as far as the first membrane structure, filling the at least one columnar through opening with the filling material in order to obtain the mechanical connection structure, and forming the first membrane structure in a patterned manner in the form of a membrane layer or a membrane layer stack on the sacrificial material and the filling material.

In accordance with one exemplary embodiment, the introducing step involves introducing a plurality of columnar through openings into the sacrificial material, said plurality being formed through the sacrificial material as far as the first membrane layer or the first membrane layer stack, the filling step furthermore involves filling the plurality of columnar through openings with the filling material, and the step of removing the sacrificial material from the intermediate region involves obtaining a plurality of mechanical connection elements between the first and second membrane structures, wherein the plurality of mechanical connection elements is mechanically coupled between the first and second membrane structures and mechanically decoupled from the counterelectrode structure.

In accordance with one exemplary embodiment, a double-membrane MEMS component comprises a layer arrangement on a carrier substrate, wherein the layer arrangement has a first and second membrane structure spaced apart from one another and a counterelectrode structure arranged therebetween, and a mechanical connection structure comprising a sacrificial material between the first and second membrane structures, which mechanical connection structure is mechanically coupled between the first and second membrane structures and mechanically decoupled from the counterelectrode structure 240.

In accordance with one exemplary embodiment, the mechanical connection structure comprising the sacrificial material has a single columnar mechanical connection element or a plurality of columnar mechanical connection elements.

In accordance with one exemplary embodiment, the double-membrane MEMS component is produced by the method.

BRIEF DESCRIPTION OF THE DRAWINGS

Exemplary embodiments of devices and/or methods are described in greater detail below by way of example with reference to the accompanying figures, in which:

FIGS. 3a-3c show one exemplary method for producing a double-membrane MEMS component in accordance with a further exemplary embodiment;

FIG. 6 shows one exemplary double-membrane MEMS component in accordance with one exemplary embodiment;

FIGS. 7a-7c show an exemplary further method for producing a double-membrane MEMS component in accordance with a further exemplary embodiment.

DETAILED DESCRIPTION OF ILLUSTRATIVE EMBODIMENTS

Figure 1A:
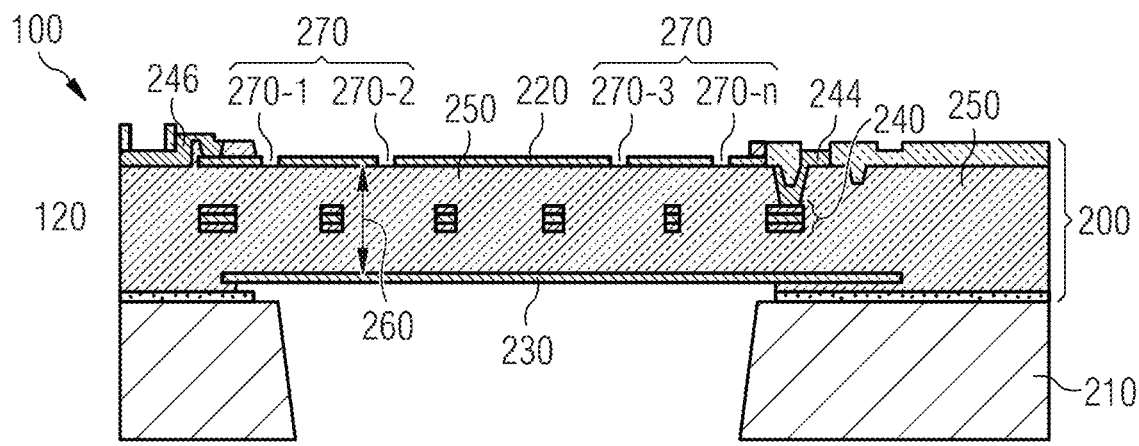
FIGS. 1a-1c show one exemplary method for producing a double-membrane MEMS component in accordance with one exemplary embodiment.

Before exemplary embodiments of the present invention are explained in more specific detail below with reference to the drawings, it is pointed out that identical, functionally identical or identically acting elements, objects, function blocks and/or method steps in the various figures are provided with the same reference signs, such that the description of said elements, objects, function blocks and/or method steps that is presented in various exemplary embodiments is mutually interchangeable or can be applied to one another.

Some embodiments are directed to MEMS components, such as e.g. acoustic MEMS sensors, and for a corresponding production method with which an acoustic MEMS sensor having good acoustic behavior and also at the same time having particle protection, i.e. protection of the air gap between movable membrane and back plate, can be obtained. Some exemplary embodiments relate to double-membrane MEMS components, such as e.g. acoustic MEMS sensors or capacitively readable double-membrane sound transducer elements, and the production methods thereof.

In accordance with one aspect, the perforation of at least one of the two membrane structures is chosen such that during the e.g., wet-chemical removal of the sacrificial material between the two membrane structures in the interspace a mechanical connection structure comprising the sacrificial material is formed between the first and second membrane structures, wherein the mechanical connection structure in the form of the at least one columnar, mechanical connection element or column elements is mechanically coupled between the first and second membrane structures and is arranged in a manner separated from the counterelectrode structure. The mechanical connection structure is thus formed from the sacrificial material deliberately remaining in the interspace since the removal or etching process is carried out only until the desired mechanical connection structure is obtained.

In accordance with a further aspect, the mechanical connection structure is already configured in the sacrificial material arranged in the intermediate region and comprises a filling material different than the sacrificial material. During the process of removing the sacrificial material from the intermediate region, the connection structure "automatically" remains between the first and second membrane structures.

The mechanical connection structure is arranged in the form of the at least one columnar, mechanical connection element between the first and second membrane structures and in a manner separated from the counterelectrode structure and comprises a filling material different than the sacrificial material. During the process of e.g., wet-chemically removing the sacrificial material from the intermediate region, the mechanical connection structure then forms between the first and second membrane structures, wherein the mechanical connection structure is in turn mechanically coupled between the first and second membrane structures and mechanically decoupled from the counterelectrode structure.

On the basis of the procedures presented above for producing a double-membrane MEMS component, e.g. a dual-membrane microphone, the required additional outlay in the production process for MEMS components can be kept very small, wherein in particular the production step of forming the mechanical connection structure in the form of the columnar, mechanical connection elements between the two membrane structures of the MEMS component can be integrated extremely simply into previous process sequences for MEMS components.

To that end, in accordance with the first aspect, the sacrificial material is "deliberately" not completely removed from the interspace between the first and second membrane structures in some embodiments, in order to form the mechanical connection structure. In the case of the further aspect, the mechanical connection structure is already configured in the sacrificial material arranged in the intermediate region and comprises a filling material different than the sacrificial material, wherein during the process of removing the sacrificial material from the intermediate region said connection structure remains between the first and second membrane structures. The filling material different than the sacrificial material comprises e.g. an etching-resistant material.

By configuring the mechanically coupled double-membrane structure with the intervening counterelectrode structure as a MEMS component, it is possible to obtain both an extremely good acoustic behavior of the MEMS component and an extremely good mechanical protection for the intermediate region between the two membrane structures. On the basis of this configuration of the MEMS components, the design of the MEMS component may be substantially independent of the respective housing type provided for the MEMS component. The double-membrane approach is thus combined with the performance advantage of two interspaces, i.e. the interspaces between respectively the first and second membrane structures and the counterelectrode structure (back plate). In this regard, in particular a differential read-out of the MEMS component is made possible, wherein the protection advantages are furthermore present in both directions as a result of the two exterior membrane structures. To put it another way, this means that the open area exposed to the surroundings can be minimized by the present MEMS component design, specifically independently of which side of the MEMS component faces the sound opening.

On the basis of the present production method for double-membrane MEMS components with the implementation of the mechanical connection elements between the two membrane structures, besides the increased mechanical protection function and mechanical stability it is furthermore also possible to improve the electrical signal behavior, such as e.g. the THD behavior (THD=Total Harmonic Distortion) and also the noise behavior (SNR=Signal to Noise Ratio) significantly by comparison with previous approaches. The mechanical, columnar connection elements can be configured in a nonconductive fashion, for example, in order to be able to read the two membrane structures as different electrodes during differential operation. Furthermore, the number and size of the columnar connection elements on the basis of the present concept can be adapted to the respective product requirements extremely simply and can thus be integrated into previous process sequences extremely simply.

The basic sequence of the method 100 for producing a double-membrane MEMS component 300 (MEMS=microelectromechanical system) in accordance with one exemplary embodiment is now presented below with reference to schematic illustrations in FIGS. 1a-c. In order to simplify the description of the geometric relationships, an x-y-z-coordinate system is furthermore illustrated by way of example in FIG. 1c, wherein the x y plane represents the plane of the drawing.

In the production method 100 for a double-membrane MEMS component, a step 120 involves providing a layer arrangement 200 on a carrier substrate 210, such as e.g. a semiconductor substrate, wherein the layer arrangement 200 has a first and a second membrane structure 220, 230 spaced apart from one another and a counterelectrode structure 240 arranged therebetween. Furthermore, a sacrificial material 250 is arranged in an intermediate region 260 between the counterelectrode structure 240 and the first and second membrane structures 220, 230 respectively spaced apart therefrom. The first membrane structure 220 comprises an opening structure 270 having at least one access opening 270-$n$ to the intermediate region 260 with the sacrificial material 250. Figure is illustrates by way of example a plurality of access openings 270-$n$, where n=1 . . . 4.

In a step 140, the sacrificial material 250 is then partly removed from the intermediate region 260 in order to obtain a mechanical connection structure 280 comprising the sacrificial material 250 between the first and second membrane structures 220, 230.

Figure 1B:
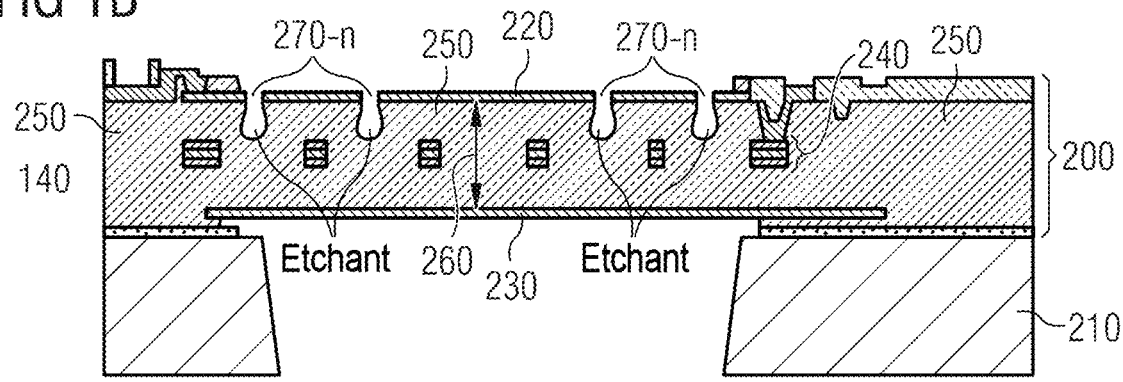

FIG. 1b then shows by way of example an intermediate stage during step 140, wherein a relatively small part of the sacrificial material 250 to be removed adjacent to the access openings 270-n was firstly removed.

Figure 1C:
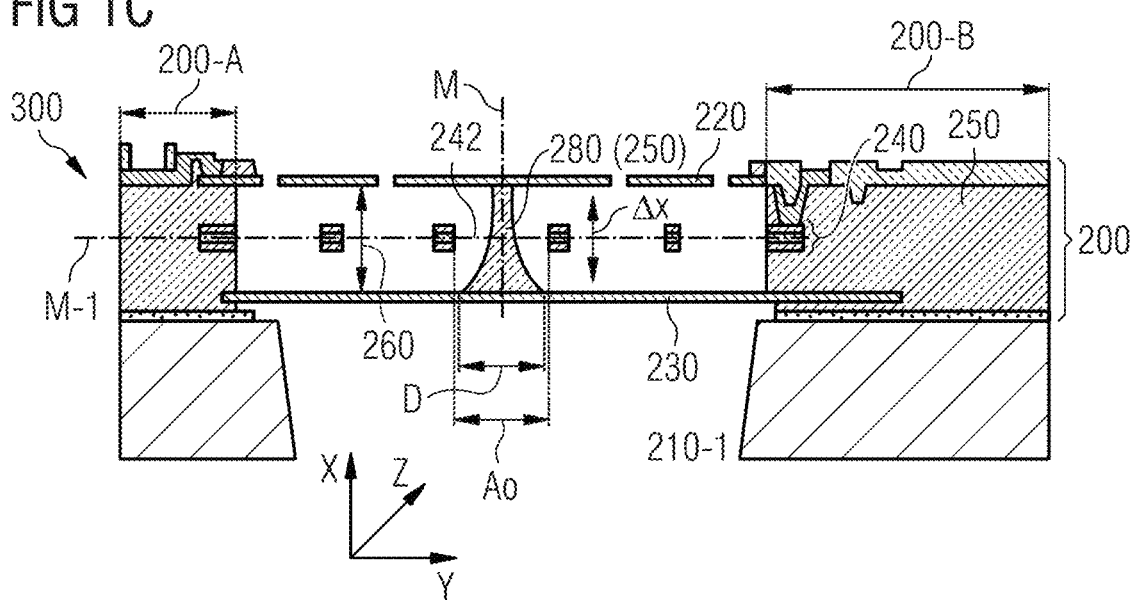

Step 140 of removing the sacrificial material 250 is then carried out until the mechanical connection structure 280 is obtained, which is configured for example in the form of a substantially columnar mechanical connection element 280, which is mechanically coupled between the first and second membrane structures 220, 230 and decoupled from the counterelectrode structure 240, as is illustrated in FIG. 1c.

As is furthermore illustrated by way of example in FIG. 1c, the mechanical connection structure 280 is mechanically connected to the first and second membrane structures 220, 230, i.e. mechanically coupled between the first and second membrane structures 220, 230. Furthermore, during the step of removing 140, the sacrificial material 250 is deliberately removed from the intermediate region such that the mechanical connection structure 280 has no mechanical connection to the counterelectrode structure 240, i.e. the mechanical connection structure 280, e.g. in the x-direction, is movable or deflectable with respect to the counterelectrode structure 240.

As is furthermore illustrated in FIG. 1c, the counterelectrode structure 240 has a "through opening" or cutout 242 in the region of the mechanical connection structure 280 configured.

As is illustrated in the coordinate system illustrated by way of example in FIG. 1c, the double-membrane arrangement comprising the first and second membrane structures 220, 230 and the mechanical connection structure 280 arranged therebetween is deflectable along a vertical direction (x-direction) with respect to the plane of the drawing, wherein a maximum deflection $\Delta x$ that is possible during normal operation is present. During the process of partly removing 140 the sacrificial material 250, the mechanical connection structure 280 is then deliberately configured such that in the range of the maximum deflection $\Delta x$ of the double-membrane arrangement 220, 230 no mechanical contact with the counterelectrode structure 240 takes place, i.e. the diameter D of the mechanical connection structure 280 within the maximum deflection range $\Delta x$ is smaller than the diameter $A_o$ of the opening 242 of the counterelectrode structure 240 through which the mechanical connection structure 280 is arranged.

The through opening 242 is thus configured such that the opening 242 defines a minimum distance $A_o$, wherein the minimum distance $A_o$ is configured as larger than a maximum diameter D of the mechanical connection element 280. To put it another way, this means that a vertical projection (in the x-direction) or the cross section of the mechanical connection element 280 is situated within the "through opening" or cutout 242. This applies at least to the maximum (vertical) deflection range $\Delta x$ of the double-membrane arrangement 220, 230 relative to a center plane M–1 (parallel to y-z-plane) of the double-membrane MEMS component 300 or else to the entire vertical dimension of the intermediate region 260.

Step 140 of partly removing the sacrificial material 250 can be carried out for example by means of an etching process, such as e.g. an anisotropic etching process, of the sacrificial material 250.

The opening structure 270 in the first membrane structure 220 is then configured geometrically, i.e. with regard to the diameter, number and distribution of the openings 270-n, so as to obtain, during the step of partly removing 140 the sacrificial material 250, a single, columnar, mechanical connection element 280 comprising the sacrificial material 250 or formed from the sacrificial material 250. As is illustrated in FIG. 1c, the opening structure 270 can have a plurality of openings 270-n, where n=2, 3, 4, . . . , through which the etchant for the etching process obtains access to the intermediate region 260 and the sacrificial material 250 situated therein. The opening structure 270 in the first membrane structure 220 is then configured geometrically so as to reproducibly form, on the basis of the resulting etching rate and etching selectivity of the etchant for the sacrificial material 250 during the etching process 140, the mechanical connection structure 280 comprising the sacrificial material 250, such that the connection structure, e.g. as a columnar single mechanical connection element 280, is mechanically coupled between the first and second membrane structures 220, 230 and mechanically decoupled from the counterelectrode structure 240.

Furthermore, the sacrificial material 250 is maintained in the edge region 200-A, 200-B of the layer arrangement 200 and is effective for example as a mechanical bearing or support structure for the first and second membrane structures 220, 230 and the counterelectrode structure 240.

The plurality of individual openings 270-n, where n=2, 3, 4, . . . , of the opening structure 270 is arranged for example symmetrically with respect to a center axis (axis of symmetry) M of the layer structure arrangement 200, such as e.g. on a circular line (e.g., in the z-y-plane), with a rectangular course or with an oval course, etc., which in each case have the axis of symmetry M as the midpoint.

In accordance with a further exemplary embodiment, the first membrane structure can also have a multiplicity of distributed individual openings 270-n, e.g. as a perforation, in the first membrane structure 220, wherein a region, e.g. around the geometric center axis M, in the first membrane structure 220 has individual openings having a larger distance between the distributed individual openings or else no individual openings, in order to predefine the position of the connection element 280, e.g. at the geometric midpoint M.

In accordance with one exemplary embodiment, the region having a larger distance between the distributed individual openings or the region without individual openings can also be provided at a position offset with respect to the center axis M, in order to configure the mechanical connection element at a position offset with respect to the geometric midpoint M between the first and second membrane structures 220, 230.

In this regard, by way of example, provision is made of the through openings 270-n with a diameter of approximately 200° nm, such as e.g. between 50 and 500° nm, between 100 and 300° nm or between 150 and 250° nm, in the membrane structure 220 and with a pitch of 5 to 10 µm, such as e.g., 1°-°50 µm or 2 to 20° µm. For example with regard to subsequent installation of the double-membrane MEMS component 300 in a housing (not shown), the through openings 270-n in the membrane structure are provided on that side of the MEMS component which faces away from the sound port, i.e. the sound opening.

Ideally, the columnar, mechanical connection element 280 has a substantially cylindrical shape, although a substantially (slightly) frustoconical contour of the mechanical connection element 280 can arise for example on account of the single-sided etching process between the membrane structures 220, 230. Since the etching process in accordance with the exemplary embodiment in FIGS. 1a-c takes place only through the first membrane structure 220, the columnar mechanical connection element proceeding from the second membrane structure 230 to the first membrane structure 220 can thus have a tapering, concave outer contour, for example. This outer contour should be assumed to be merely by way of example since different opening structures having a different number and a different distribution of the individual openings 270-n have an influence on the resulting geometric shape of the columnar mechanical connection element 280.

In accordance with exemplary embodiments in FIGS. 1a-1c, the first membrane structure 220 is arranged for example at a distance from the carrier substrate 210, while the second membrane structure 230 is arranged substantially adjacent to the semiconductor substrate 210 or the cavity 210-1 arranged in the carrier substrate 210. In accordance with exemplary embodiments, it is also possible, of course, for the second membrane structure 230 to have the opening structure or perforation 270, while the first membrane structure 220 is configured in a substantially closed fashion.

The above explanations with regard to the method steps in FIGS. 1a-1c are then equally applicable to a corresponding configuration, wherein the etching process is then implemented proceeding from opening structures arranged in the second membrane structure 230 (not shown in FIGS. 1a-1c).

In accordance with one exemplary embodiment, further layers (not shown in FIGS. 1a-1c) can furthermore be provided as intermediate layers, insulation layers, insulation layers with embedded conductor tracks and/or else passivation layers. As an etchant-resistant material, by way of example, a nitride material can be used for the further layers. Further intermediate layers can be provided for example for anchoring the membrane structures and counterelectrode structure, while conductor tracks embedded in insulation layers can be provided for electrical contacting. A passivation layer can be provided as a protection layer. Furthermore, conductive contact elements 244, 246 can be provided, for example, in order to provide electrical contacting regions for the membrane structures 220, 230 and respectively the counterelectrode structure 240.

In accordance with exemplary embodiments, the sacrificial layer can comprise an oxide material, such as e.g. silicon oxide. In accordance with exemplary embodiments, the first and second membrane structures 220, 230 and the counterelectrode structure 240 can comprise a semiconductor material, such as e.g. (polycrystalline or monocrystalline) silicon. Exemplary etchants can comprise e.g., $HNO_3+HF$, KOH, EDP or TMAH for a wet etching process.

Figure 2A:
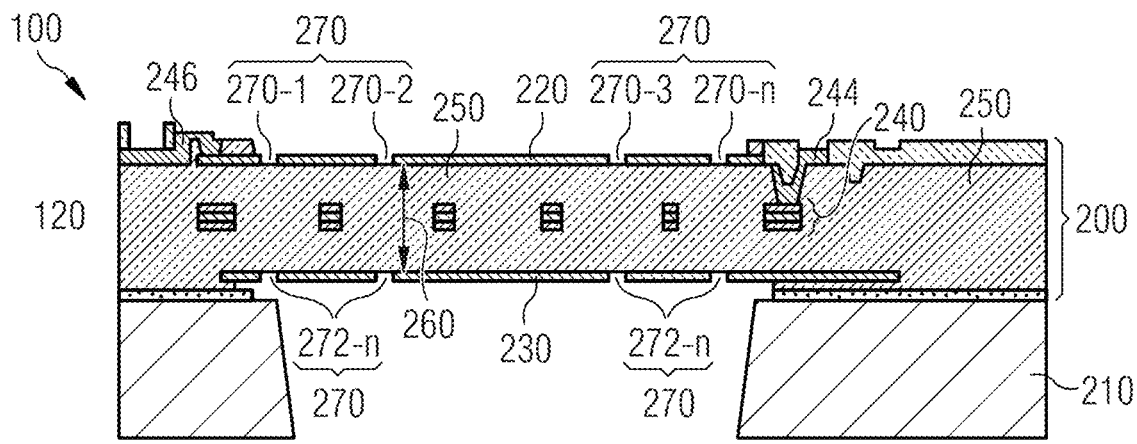
FIGS. 2a-2c show one exemplary method for producing a double-membrane MEMS component in accordance with a further exemplary embodiment.

Exemplary embodiments of one exemplary method 100 for producing a double-membrane MEMS component will now be described below with reference to FIGS. 2a-2c.

In the production method 100 for a double-membrane MEMS component, a step 120 involves providing a layer arrangement 200 on a carrier substrate 210, such as e.g. a semiconductor substrate, wherein the layer arrangement 200 has a first and a second membrane structure 220, 230 spaced apart from one another and a counterelectrode structure 240 arranged therebetween. Furthermore, a sacrificial material 250 is arranged in an intermediate region 260 between the counterelectrode structure 240 and the first and second membrane structures 220, 230 respectively spaced apart therefrom. In the exemplary embodiment illustrated in FIG. 2a, both membrane structures 220, 230 now each have an opening structure 270, 272 having a plurality of access openings 270-n, 272-n, e.g. where n=2, 3, 4, 5, . . . , to the intermediate region 260 with the sacrificial material 250. Four access openings 270-n, 272-n are illustrated by way of example in FIG. 2a.

In step 140, the sacrificial material 250 is then partly removed from the intermediate region 260 in order to obtain a mechanical connection structure 280 comprising the sacrificial material 250 between the first and second membrane structures 220, 230.

Figure 2B:
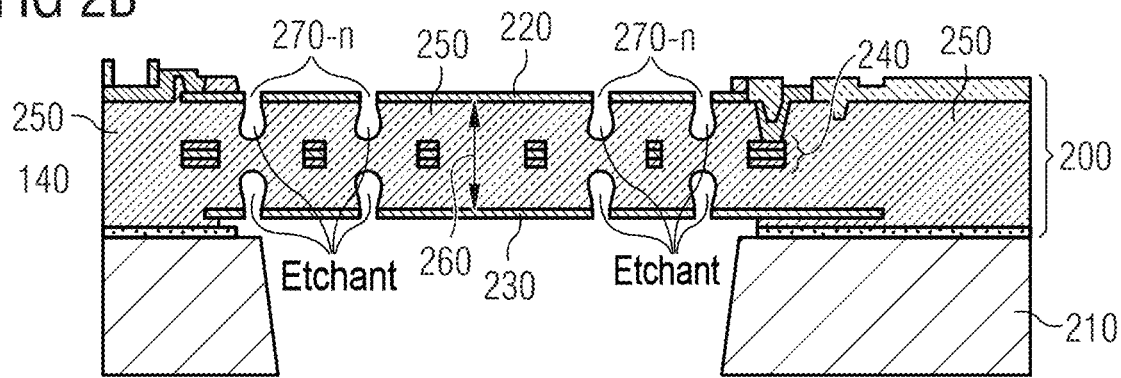

FIG. 2b then shows by way of example an intermediate stage during step 140, wherein a relatively small part of the sacrificial material 250 to be removed adjacent to the access openings 270-n, 272-n was firstly removed. Step 140 of removing the sacrificial material 250 is then carried out until the mechanical connection structure 280 is obtained, which is configured for example in the form of a substantially columnar mechanical connection element 280, which is mechanically coupled between the first and second membrane structures 220, 230 and decoupled from the counterelectrode structure 240, as is illustrated in FIG. 2c.

Figure 2C:
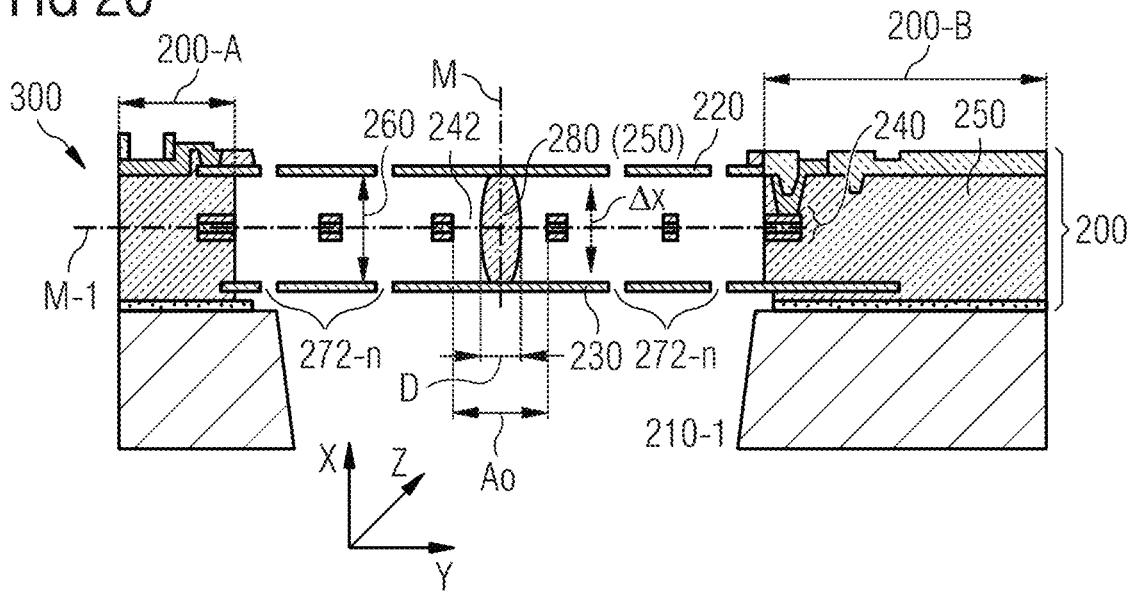

As is furthermore illustrated by way of example in FIG. 2c, the mechanical connection structure 280 is mechanically connected to the first and second membrane structures 220, 230, i.e. mechanically coupled between the first and second membrane structures 220, 230. Furthermore, during the step of removing 140 the sacrificial material 250, the sacrificial material is deliberately removed from the intermediate region such that the mechanical connection structure 280 has no mechanical connection to the counterelectrode structure 240, i.e. the mechanical connection structure 280 is movable or deflectable with respect to the counterelectrode structure 240.

As is furthermore illustrated in FIG. 2c, the counterelectrode structure 240 has, in the region of the mechanical connection element 280 configured, a "through opening" or cutout 242 configured such that the opening 242 defines a minimum distance $A_o$. The through opening 242 is then once again configured such that in the range of the maximum deflection $\Delta x$ of the double-membrane arrangement 220, 230 no mechanical contact with the counterelectrode structure 240 takes place.

The opening structures 270, 272 in the first and second membrane structures 220, 230, respectively, are once again configured geometrically, i.e. with regard to diameter, number and distribution, so as to reproducibly form, during the step of partly removing 140 the sacrificial material 250 on the basis of the etching rate and etching selectivity of the etchant for the sacrificial material 250 during the etching process 140, the mechanical connection element 280 comprising the sacrificial material, such that the connection structure 280 is mechanically coupled between the first and second membrane structures and mechanically decoupled from the counterelectrode structure.

Furthermore, the sacrificial material 250 is maintained in the edge region 200-A, 200-B of the layer arrangement 200 and is effective for example as a mechanical bearing or support structure for the first and second membrane structures 220, 230 and the counterelectrode structure 240.

The opening structures 270, 272 in the first and second membrane structures 220, 230, respectively, have for example individual openings 270-n, 272-n on a circular line, wherein the circular line can be arranged in a manner centered with respect to a geometric midpoint or a geometric center axis M of the layer structures 220, 230. The individual openings 270-n, 272-n of the first and second connection structures 280, 282 are thus arranged for example symmetrically around a geometric midpoint M of the first and second membrane structures 220, 230.

In accordance with a further exemplary embodiment, the opening structures 270, 272 can have a multiplicity of distributed individual openings 270-n, 272-n in the form of a perforation in the first and/or second membrane structure 220, 230, wherein a region having a larger distance between the distributed individual openings 270-n, 272-n is provided in order to predefine a position of a connection element 280. These regions having a larger distance between the distributed individual openings 270, 272 are arranged symmetrically with respect to one another, e.g. in an overlapping manner or in a manner lying one above another in relation to a projection in the x-direction, in the first and second membrane structures 220, 230.

In accordance with one exemplary embodiment, the regions having a larger distance between the distributed individual openings or without individual openings can also be provided at a position offset with respect to the center axis M in order to configure the mechanical connection element at a position offset with respect to the geometric midpoint M between the first and second membrane structures 220, 230.

On account of the two-sided etching process in FIG. 2c, the resulting connection structure 280 configured as a columnar, mechanical connection element has a for example cylindrical outer contour, wherein, on account of the etching process, the outer contour between the two membrane structures 220, 230 can furthermore also be configured (slightly) convexly relative to the ideal cylindrical contour, depending on the etching rate. Furthermore, a round, circular or else elliptic cross section of the mechanical connection element 280 can be obtained depending on the geometric arrangement of the individual openings 270-n, 272-n.

In this regard, by way of example, provision is made of the through openings 270-n, 272-n with a diameter of approximately 200 nm, such as e.g. between 50 and 500 nm, between 100 and 300 nm or between 150 and 250 nm, in at least one of the two membrane structures 220, 230 and with a pitch of 5 to 10 µm, such as e.g. 1-50 µm or 2 to 20 µm.

Exemplary embodiments of the method 100 for producing a double-membrane MEMS component 300 will now be described below with reference to FIGS. 3a-3c, wherein the first membrane structure 220 has the opening structure 270 to the intermediate region 260 with the sacrificial material 250, wherein the opening structure 270 in the first membrane structure 220 is furthermore configured geometrically so as to form a plurality of columnar, mechanical connection elements 280-n as the connection structure 280, wherein the connection elements 280-n comprise or are formed from the sacrificial material 250 and extend between the first and second membrane structures 220, 230.

In contrast to the method 100 described with reference to FIGS. 1a-1c, in the method 100 described with reference to FIGS. 3a-3c, the opening structure 270 in the first membrane structure 220 is thus configured geometrically so as to form a plurality of columnar, mechanical connection elements 280-n as the connection structure 280. The explanations for FIGS. 1a-1c are thus otherwise equally applicable to the method 100 for producing a double-membrane MEMS component 300 described with reference to FIGS. 3a-3c, i.e. the explanations with reference to FIGS. 1a-c with regard to forming a single connection element 280 are equally applicable to forming the respective connection elements 280-n of the plurality of connection elements 280-n such as are obtained in the method 100 for producing a double-membrane MEMS component 300 described in FIGS. 3a-3c.

The first membrane structure 220 comprises an opening structure 270 having a plurality of access openings 270-n to the intermediate region 260 with the sacrificial material 250. Five access openings 270-n, where n=5, are illustrated by way of example in FIG. 3a.

In a step 140, the sacrificial material 250 is then partly removed from the intermediate region 260 in order to obtain a mechanical connection structure 280 comprising the sacrificial material 250 between the first and second membrane structures 220, 230.

FIG. 3b then shows by way of example an intermediate stage in step 140, wherein a relatively small part of the sacrificial material 250 to be removed adjacent to the access openings 270-n was firstly removed.

Step 140 of removing the sacrificial material 250 is then carried out until the mechanical connection structure 280 having a plurality of mechanical connection elements 280-n is obtained, which are mechanically coupled between the first and second membrane structures 220, 230 and decoupled from the counterelectrode structure 240, as is illustrated in FIG. 3c. During the step of removing 140, the sacrificial material 250 is deliberately removed from the intermediate region 260 such that the mechanical connection elements 280-n have no mechanical contact with the counterelectrode structure 240, i.e. the mechanical connection structure 280, e.g. in the x-direction, is movable or deflectable with respect to the counterelectrode structure 240.

Furthermore, the sacrificial material 250 is maintained in the edge region 200-A, 200-B of the layer arrangement 200 and is effective for example as a mechanical bearing or support structure for the first and second membrane structures 220, 230 and the counterelectrode structure 240.

As is furthermore illustrated in FIG. 3c, the counterelectrode structure 240 has, in the region of the mechanical connection structure 280 configured, a plurality of through openings 242-n configured such that the openings 242 define a minimum distance $A_N$, wherein the cross section of the mechanical connection elements 280-n is situated within the respectively assigned through opening 242-n. This applies at least to the maximum (vertical) deflection range $\Delta x$ of the double-membrane arrangement 220, 230 or else to the entire vertical dimension of the intermediate region 260.

Step 140 of partly removing the sacrificial material 250 can be carried out for example by means of an etching process, such as e.g. an anisotropic etching process, of the sacrificial material 250.

The opening structure 270 in the first membrane structure 220 is then configured geometrically, i.e. with regard to the diameter, number and distribution of the openings 270-n, so as to reproducibly form, during the step of partly removing 140 the sacrificial material 250 on the basis of the resulting etching rate and etching selectivity of the etchant for the sacrificial material 250 during the etching process 140, the mechanical, columnar connection elements 280-n comprising the sacrificial material 250, which are mechanically coupled between the first and second membrane structures 220, 230 and mechanically decoupled from the counterelectrode structure 240.

Ideally, the columnar, mechanical connection elements 280-n have a substantially cylindrical shape, although a substantially frustoconical shape of the mechanical connection elements 280-n can arise for example on account of the single-sided etching process proceeding from one of the membrane structures 220, 230.

In accordance with exemplary embodiments in FIGS. 3a-3c, the first membrane structure 220 is arranged for example at a distance from the carrier substrate 210, while the second membrane structure 230 is arranged substantially adjacent to the semiconductor substrate 210 or the cavity 210-1 arranged in the carrier substrate 210. In accordance with exemplary embodiments, it is also possible, of course, for the second membrane structure 230 to have the opening structure or perforation 270, while the first membrane structure 220 is configured in a substantially closed fashion. The above explanations with regard to the method steps in FIGS. 3a-3c are then equally applicable to a corresponding configuration of the layer arrangement 200, wherein the etching process is then implemented proceeding from the opening structures arranged in the second membrane structure 230 (not shown in FIGS. 3a-3c).

Exemplary embodiments of the method 100 for producing a double-membrane MEMS component 300 will now be described below with reference to FIGS. 4a-4c, wherein the first membrane structure 220 has the opening structure 270 and also the second membrane structure 230 has the further opening structure 272, wherein the opening structures 270, 272 in the first and second membrane structures 220, 230 are configured geometrically so as to obtain, during the step 140 of partly removing the sacrificial material 250, a plurality of columnar, mechanical connection elements 280 comprising the sacrificial material as the mechanical connection structure 280 between the first and second membrane structures 220, 230.

In contrast to the method 100 described with reference to FIGS. 2a-2c, in the method 100 described with reference to FIGS. 4a-4c, the opening structure 270 in the first membrane structure 220 and the opening structure 272 in the second membrane structure 230 are now configured geometrically so as to form a plurality of columnar, mechanical connection elements 280-$n$ as the connection structure 280. The explanations for FIGS. 2a-2c are thus otherwise equally applicable to the method 100 for producing a double-membrane MEMS component 300 described with reference to FIGS. 4a-4c.

Figure 4A:
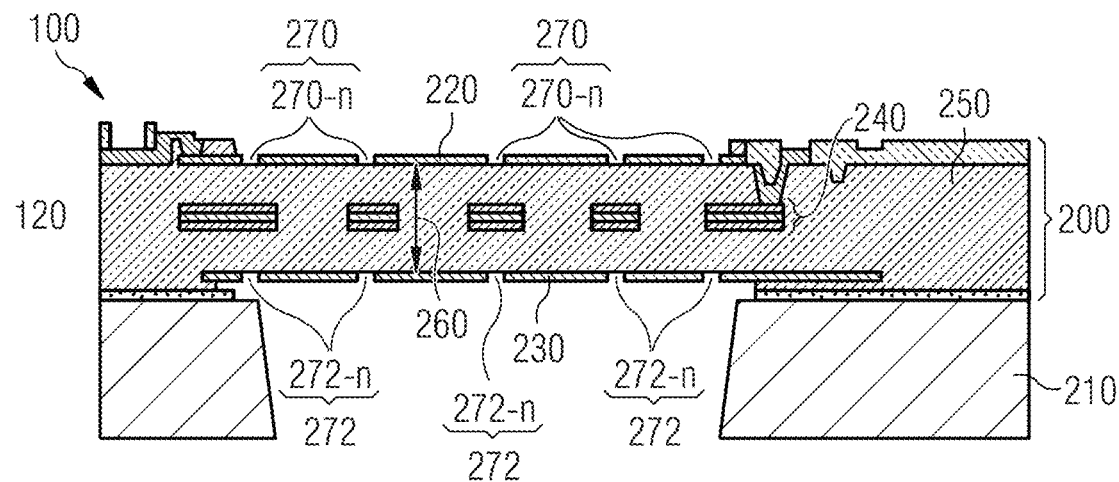
FIGS. 4a-4c show one exemplary method for producing a double-membrane MEMS component in accordance with a further exemplary embodiment.

In the exemplary embodiment illustrated in FIG. 4a, then, both membrane structures 220, 230 each have an opening structure 270, 272 having a plurality of access openings 270-$n$, 272-$n$, where n=2, 3, 4, 5, ..., to the intermediate region 260 with the sacrificial material 250. In each case five access openings 270-$n$, 272-$n$, where n=5, are illustrated by way of example in FIG. 4a.

In the step 140, the sacrificial material 250 is then partly removed from the intermediate region 260 in order to obtain a mechanical connection structure 280 comprising the sacrificial material 250 between the first and second membrane structures 220, 230.

Figure 4B:
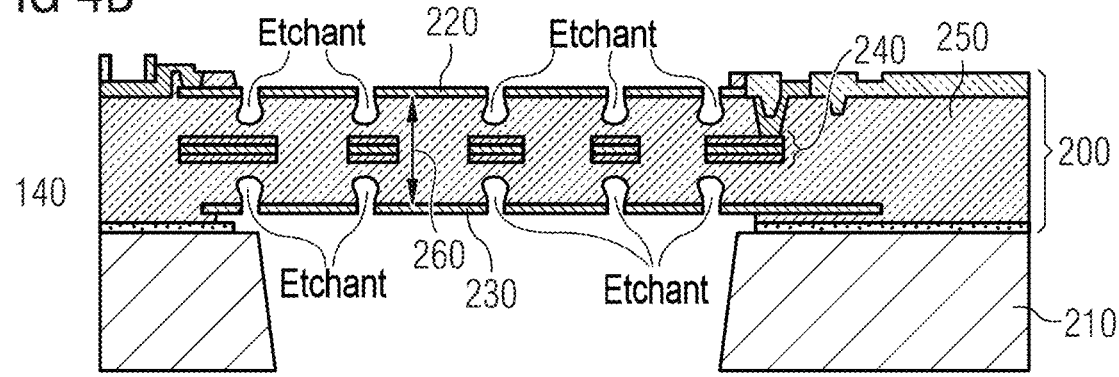

FIG. 4b then shows by way of example an intermediate stage in step 140, wherein a relatively small part of the sacrificial material 250 to be removed adjacent to the access openings 270-$n$, 272-$n$ was firstly removed. Step 140 of removing the sacrificial material 250 is then carried out until the mechanical connection structure 280 having the plurality of substantially columnar mechanical connection elements 280-$n$ is configured, which are mechanically coupled between the first and second membrane structures 220, 230 and decoupled from the counterelectrode structure 240, as is illustrated in FIG. 4c. Furthermore, during the step of removing 140 the sacrificial material 250, the sacrificial material is deliberately removed from the intermediate region such that the mechanical connection structure 280 has no mechanical connection to the counterelectrode structure 240, i.e. the mechanical connection structure 280 is movable or deflectable with respect to the counterelectrode structure 240.

Figure 4C:
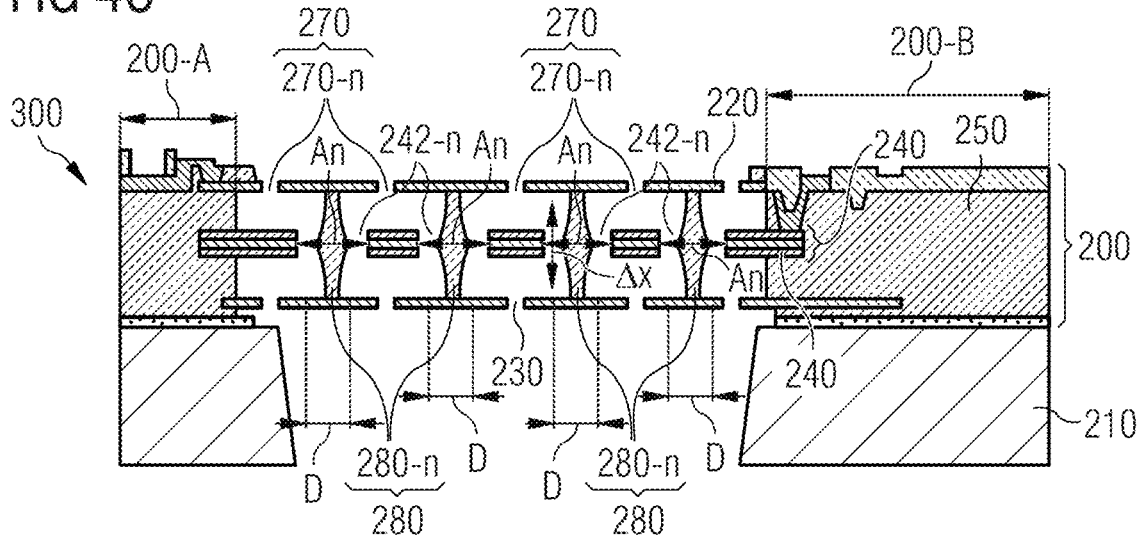

As is furthermore illustrated in FIG. 4c, the counterelectrode structure 240 has, in the region of the mechanical connection elements 280-$n$ configured, a plurality of through openings 242-$n$ configured such that the openings 242 define a minimum distance AN, such that in the range of the maximum deflection Δx of the double-membrane arrangement 220, 230 no mechanical contact with the counterelectrode structure 240 takes place.

The opening structures 270, 272 in the first and second membrane structures 220, 230, respectively, are once again configured geometrically, i.e. with regard to the diameter, number and distribution, so as to reproducibly form, on the basis of the etching rate and etching selectivity of the etchant for the sacrificial material 250 during the etching process 140, the mechanical connection elements 280-$n$ comprising the sacrificial material, such that the connection elements 280-$n$ are mechanically coupled between the first and second membrane structures 220, 230 and mechanically decoupled from the counterelectrode structure 240.

On account of the two-sided etching process in FIG. 4c, the resulting columnar, mechanical connection elements 280-$n$ have a for example cylindrical outer contour, wherein, on account of the etching process, the outer contour between the two membrane structures 220, 230 can furthermore also be configured concavely relative to the ideal cylindrical contour, depending on the etching rate. Furthermore, a round, circular or else elliptic cross section of the mechanical connection element 280' can be obtained depending on the geometric arrangement, i.e. with regard to the diameter, number and distribution, of the individual openings.

Figure 5:
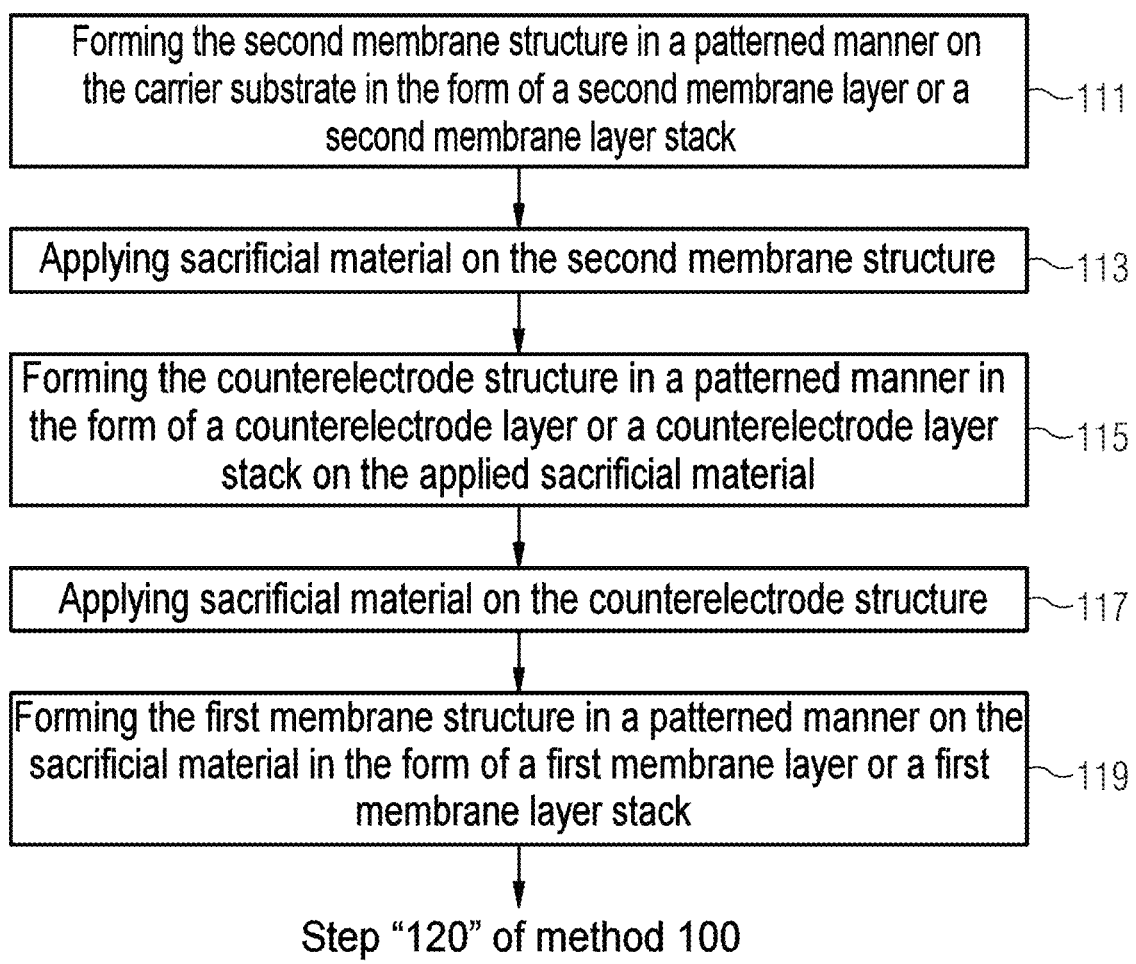
FIG. 5 show one exemplary method for configuring the layer structure as a starting point of the production method in accordance with one exemplary embodiment.

Exemplary embodiments of the production steps of the production method 100 for a double-membrane MEMS component 300 in order to obtain the layer structure arrangement 200 present in the step of providing 120 will now be described below with reference to FIG. 5. In accordance with one exemplary embodiment, the basic method steps presented below are carried out for example before the step of providing 120 the layer structure arrangement 200.

A step 111 involves for example firstly forming or applying a membrane structure 230 in a structured manner in the form of a first membrane layer or a first membrane layer stack on the carrier substrate 210, which comprises for example a semiconductor substrate 212 and an insulation layer 214 arranged thereon. The step of applying 111 can be carried out for example by means of a deposition process. The membrane layer 230 described can form for example the second membrane layer 230 described above.

Afterward, a step 113 involves applying sacrificial material 250 on the (second) membrane structure 230.

A step 115 involves applying or depositing the counterelectrode structure 240 in a structured manner in the form of a counterelectrode layer or a counterelectrode layer stack on the applied sacrificial material 215.

A step 117 involves applying (further) sacrificial material 250 on the counterelectrode structure 240.

A step 119 subsequently involves applying or depositing the first membrane structure 220 in a structured manner in the form of a further membrane layer or a further membrane layer stack on the sacrificial material 250, such that the sacrificial material 250 is situated in the interspace between the counterelectrode structure 240 and the first and second membrane structures 220, 230 respectively spaced apart therefrom.

In further process steps, in accordance with exemplary embodiments, further elements of the double-membrane MEMS component, such as e.g. contact structures for the first and second membrane structures and the counterelectrode structure, passivation layers, etc., can furthermore be configured. In accordance with one exemplary embodiment, further layers can furthermore be provided as intermediate layers, insulation layers, insulation layers with embedded conductor tracks and/or else passivation layers. As an etchant-resistant material, by way of example, a nitride material can be used for the further layers. Further intermediate layers can be provided for example for anchoring the membrane structures and counterelectrode structure, while conductor tracks embedded in insulation layers can be provided for electrical contacting. A passivation layer can be provided as a protection layer.

In a further subsequent step, a cavity 210-1 can be formed into the semiconductor substrate or carrier substrate 210 for example by means of an etching process (e.g., Bosch etching process) in order to expose the membrane structure 220, 230 or the movable section of the membrane structure 220, 230.

The resulting layer structure arrangement 200 can thus form the starting point for the production method 100 such as has been described above.

One exemplary embodiment of a double-membrane MEMS component 300 will now be described below with reference to FIG. 6.

The double-membrane MEMS component 300 comprises for example a layer structure arrangement 200 on a carrier or semiconductor substrate 210, wherein the layer arrangement 200 has a first and second membrane structure 220, 230 spaced apart from one another and a counterelectrode structure 240 arranged therebetween. Furthermore, a mechanical connection structure 280 comprising a sacrificial material 250 is arranged between the first and second membrane structures 220, 230, wherein the mechanical connection structure 280 is mechanically coupled between the first and second membrane structures 220, 230 and mechanically decoupled from the counterelectrode structure 240.

In accordance with one exemplary embodiment, the mechanical connection structure 280 comprising the sacrificial material 250 comprises a single columnar mechanical connection element 280 or optionally a plurality of columnar mechanical connection elements 280-n.

The double-membrane MEMS component 300 can be produced in accordance with the method 100 described above, wherein the explanations there are equally applicable to the exemplary embodiment of the double-membrane MEMS component 300 illustrated in FIG. 6.

One exemplary embodiment of a method 150 for producing a double-membrane MEMS component 310 will now be described below with reference to FIG. 7.

A step 180 involves firstly providing a layer arrangement 200' on a carrier or semiconductor substrate 210, wherein the layer arrangement 200' has a first and second membrane structure 220, 230 spaced apart from one another and a counterelectrode structure 240 arranged therebetween. Furthermore, a sacrificial material 250 is arranged in an intermediate region 260 between the counterelectrode structure 240 and the first and second membrane structures 220, 230 respectively spaced apart therefrom, wherein in the sacrificial material 250 there is formed a mechanical connection structure 280' comprising at least one columnar, mechanical connection element 280'-n, which is arranged between the first and second membrane structures 220, 230 and in a manner separated from the counterelectrode structure 240 and comprises a filling material 252 different than the sacrificial material 250. Furthermore, at least one of the two membrane structures 220, 230 has an opening structure 270, 272 to the intermediate region 260 with the sacrificial material 250.

A further step 190 then involves removing the sacrificial material 250 from the intermediate region 260 to an extent so as to expose the at least one columnar, mechanical connection element 280' and/or (optionally) 280'-n between the first and second membrane structures 220, 230, such that the at least one columnar, mechanical connection element 280', 280'-n is mechanically coupled between the first and second membrane structures 220, 230 and mechanically decoupled from the counterelectrode structure 240.

FIG. 7b then shows by way of example an intermediate stage in step 190, wherein a relatively small part of the sacrificial material 250 to be removed adjacent to the access openings 270-n, 272-n was firstly removed. Step 190 of removing the sacrificial material 250 is then carried out until the mechanical connection structure 280', 280'-n is configured, which is mechanically coupled between the first and second membrane structures 220, 230 and decoupled from the counterelectrode structure 240, as is illustrated in FIG. 7c.

Furthermore, the sacrificial material 250 is maintained in the edge region 200'-A, 200'-B of the layer arrangement 200' and is effective for example as a mechanical bearing or support structure for the first and second membrane structures 220, 230 and the counterelectrode structure 240.

In accordance with one exemplary embodiment, the step of removing the sacrificial material 250 can be carried out by means of an anisotropic etching process using an etchant, wherein the etchant has an etching rate that is considerably higher for the sacrificial material 250 than for the filling material 280', 280'-n. Depending on whether only one of the membrane structures 220 or both of the membrane structures 220, 230 has or have the opening structure 270, 272 to the intermediate region 260 with the sacrificial material 250, the etching process can be carried out from one side or two sides of the layer arrangement 200'.

Figure 8:
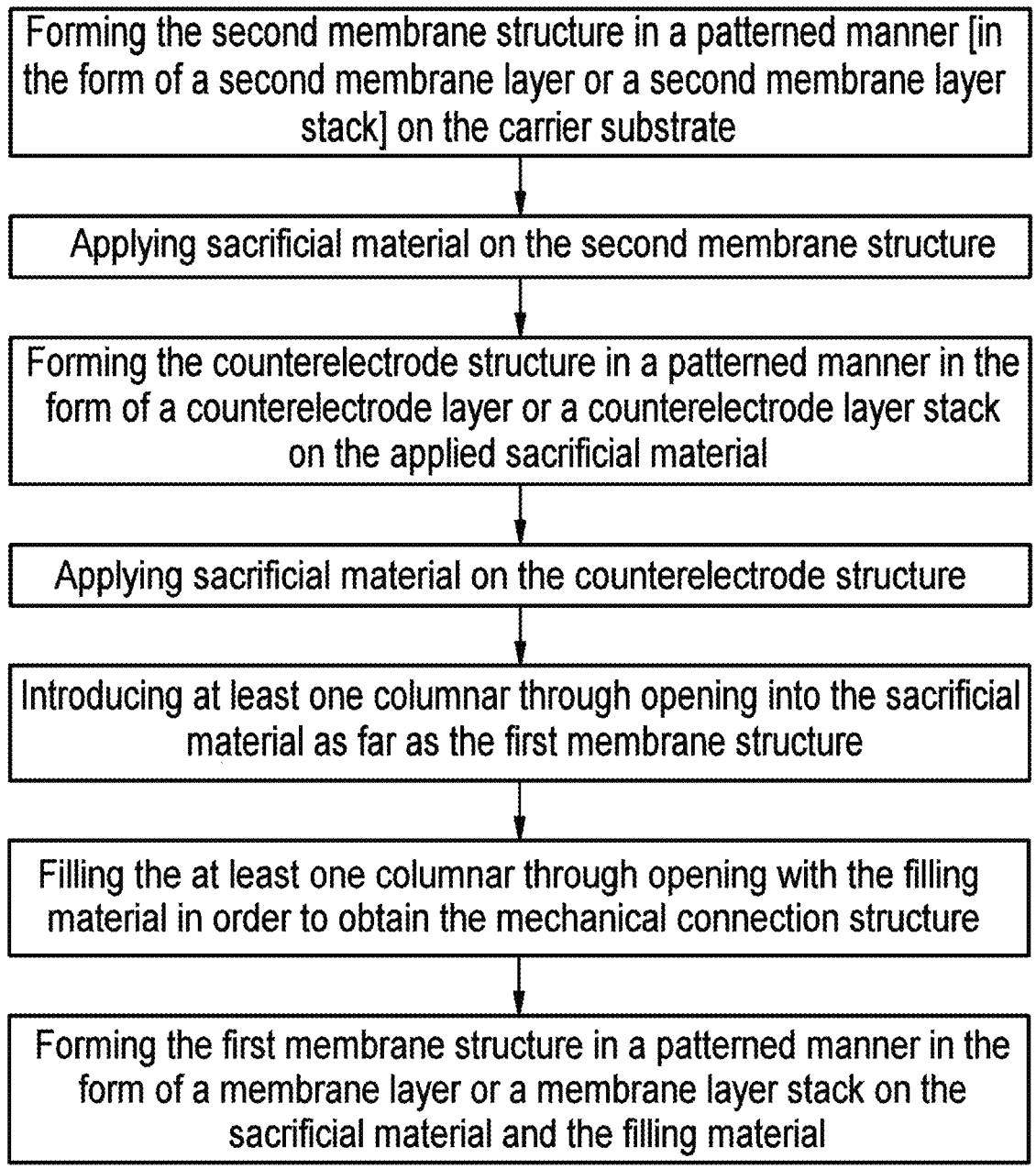
FIG. 8 shows one exemplary method for forming the layer structure as the starting point of the further production method in accordance with one exemplary embodiment.

Exemplary embodiments of the production steps of the production method 150 for a double-membrane MEMS component 310 in order to obtain the layer structure arrangement 200' present in the step of providing 180 will now be described below with reference to FIG. 8. In accordance with one exemplary embodiment, the basic method steps presented below are carried out for example before the step of providing 180 the layer arrangement 200', wherein the layer arrangement 200' can be applied on a carrier substrate 210, such as e.g. a semiconductor substrate.

In accordance with one exemplary embodiment, the method e.g., furthermore comprises the following steps: forming the second membrane structure in a patterned manner e.g., in the form of a second membrane layer or a second membrane layer stack on the carrier substrate, applying sacrificial material on the second membrane structure, forming the counterelectrode structure in a patterned manner in the form of a counterelectrode layer or a counterelectrode layer stack on the applied sacrificial material, applying sacrificial material on the counterelectrode structure, introducing at least one columnar through opening into the sacrificial material as far as the first membrane structure, filling the at least one columnar through opening with the filling material in order to obtain the mechanical connection structure, and forming the first membrane structure in a patterned manner in the form of a membrane layer or a membrane layer stack on the sacrificial material and the filling material.

In a further subsequent step, a cavity 210-1 can be formed into the semiconductor substrate or carrier substrate for example by means of an etching process (e.g., Bosch etching process) in order to expose the membrane structure or the movable section of the membrane structure.

In accordance with one exemplary embodiment, the introducing step can involve introducing a plurality of columnar through openings into the sacrificial material. The through openings are formed e.g., through the sacrificial material as far as the second membrane layer or the second membrane layer stack. Afterward, the filling step can furthermore involve filling the plurality of columnar through openings with the filling material, wherein the step of removing the sacrificial material from the intermediate region involves obtaining a plurality of mechanical connection elements between the first and second membrane structures, wherein the plurality of mechanical connection elements is mechanically coupled between the first and second membrane structures and mechanically decoupled from the counterelectrode structure.

In accordance with one exemplary embodiment, further layers (not shown) can furthermore be provided as intermediate layers, insulation layers, insulation layers with embedded conductor tracks and/or else passivation layers. As an etchant-resistant material, by way of example, a nitride material can be used for the further layers. Further intermediate layers can be provided for example for anchoring the membrane structures and counterelectrode structure, while conductor tracks embedded in insulation layers can be provided for electrical contacting. A passivation layer can be provided as a protection layer.

In accordance with exemplary embodiments, the sacrificial layer can comprise an oxide material, such as e.g. silicon oxide. In accordance with exemplary embodiments, the filling material or the mechanical connection structure can comprise an etchant-resistant material, e.g. a nitride material. In accordance with exemplary embodiments, the first and second membrane structures 220, 230 and the counterelectrode structure 240 can comprise a semiconductor material, such as e.g. (polycrystalline or monocrystalline) silicon. Exemplary etchants can comprise e.g. $HNO_3+HF$, KOH, EDP or TMAH for a wet etching process.

As has already been explained above, the present concept is applicable for example to double-membrane MEMS components, such as e.g. MEMS pressure transducers, acoustic MEMS sensors or MEMS sound transducers in the form of MEMS microphones or MEMS loudspeakers.

Double-membrane MEMS components yield both a very good acoustic behavior and an effective protection, e.g. particle protection, with a single microphone design, that is to say that a housing-dependent MEMS component design is not necessary. The present approach for a double-membrane MEMS component combines the performance advantages resulting from the presence of two air gaps, i.e. between the first and second membrane structures and the counterelectrode structure, as a result of which a differentially readable design is obtained, and furthermore the protection advantage of the membrane structure in both directions. This means, in other words, that the open area exposed with respect to the surroundings is minimized by the double-membrane MEMS component construction.

In accordance with exemplary embodiments, use is made of one mechanical connection element 280 or a plurality of mechanical connection elements 280-$n$ between the two membrane structures 220, 230 in order to maximize the acoustic behavior of the MEMS component, such as e.g. the THD behavior and the SNR behavior. The mechanical connection elements, which are also referred to as columnar connection elements or connection columns, can be non-conductive, for example, in order to realize the first and second membrane structures as two electrodes for differential operation. The number and size of the columns can be varied and adapted depending on the product requirements of the double-membrane MEMS component. Consequently, each of the membrane structures can provide a different output signal, wherein the signals can be read out differentially. Furthermore, both membrane structures realize particle protection from the respective side at which the membrane structures are situated.

During the read-out process, for example, a microphone bias or bias voltage can be applied to the counterelectrode structure (also called back plate). The columnar connection elements 280 thus form a mechanical coupling between the first and second membrane structures 220, 230. Furthermore, the mechanical connection elements are mechanically decoupled from the counterelectrode structure 240, i.e. configured as movable with respect to the counterelectrode structure 240.

In order to expose the interspace 260, i.e. the respective air gap between the counterelectrode structure 240 and the first and second membrane structures 220, 230, a perforation e.g., in the form of through openings is provided in at least one of the membrane structures 220, 230 or else in both membrane structures. The degree of perforation used and the detailed design of the through openings can depend for example on production-dictated boundary conditions and the degree of particle protection required. The density and size of the exposure etching openings or release openings can differ significantly from the configuration of the perforated back plate, i.e. the counterelectrode structure, 240. In general, the perforation density of the back plate 240 will be as high as possible for minimized acoustic noise, while the perforation density of the membrane structures will be as low as possible in order to achieve the highest possible or maximum particle protection.

In this regard, by way of example, through openings with a diameter of 200 nm in at least one of the two membrane structures 220, 230 and with a pitch of 5 to 10 µm are sufficient, such as e.g. respective openings in the membrane structure which are situated on the side of the MEMS component facing away from the sound port, i.e. the sound opening in order to enable the exposure etching process of the sacrificial layer(s) in the intermediate region 260, i.e. in the two sections 260-1, 260-2.

In order to enable a defined ventilation of the back volume, at least one opening in each of the two membrane structures is necessary, assuming that no ventilation opening is provided otherwise in the housing. For further protection from the surroundings, a hydrophobic coating of one or both membrane structures can furthermore be provided, e.g. by coating with FDTS (perfluorodecyltrichlorosilane).

Since the columnar connection elements 280 mechanically stiffen the membrane structures 220, 230, the perforation openings can be combined or replaced by slots in the membrane structures 220, 230, wherein spring structures are thereby formed which bring the membrane structures to the desired compliance or flexibility, for example, or make them softer. Such spring structures situated only near or directly adjacent to the edge of the membrane structures outside the columnar mechanical connection elements 280 will lead to a piston-like movement of the membrane structures 220, 230 mechanically coupled to one another. Since the main surface of the membrane structures is a rigid or stiff plate, the latter moves parallel to the back plate, as a result of which an increase in the resulting output signal can be achieved.

In accordance with exemplary embodiments, the number of columnar mechanical connection elements can furthermore be reduced to a single columnar mechanical connection element 280 in the center of both membrane structures 220, 230. The acoustic behavior of a MEMS microphone is greatly dependent on the flexibility and compliance of the membrane structures. A single columnar, mechanical connection element gives both membrane structures 220, 230 a higher flexibility than the use of a plurality of columnar mechanical connection elements. In actual fact, the resonant frequency of the first mechanical mode of the two membrane structures mechanically connected to one another can be brought to close correspondence with the resonant frequency of a single membrane structure. Therefore, in accordance with one exemplary embodiment, the arrangement of a single, central, columnar, mechanical connection element can yield a very similar acoustic behavior in comparison with a double-back-plate design by virtue of identical membrane thicknesses and stress levels being maintained, for example.

In accordance with exemplary embodiments, it is possible to realize the columnar connection elements during the "partial" etching process by using the limited "range" during the etching of oxide material as sacrificial material, such that the mechanical connection structure having a columnar single connection element or a plurality of columnar connection elements comprising the sacrificial material remains in the interspace 260. Consequently, no additional production process is required to form the mechanical connection structure 280.

For the case of an undercut of the sacrificial oxide of 10 μm, for example a closed membrane ring of 25 μm will leave a 5 μm wide column in the interspace 260. Further concepts for realizing the columnar connection elements can furthermore consist in using additional etching and decomposition processes with different materials, such as e.g. silicon, silicon nitride, etc.

Double-membrane MEMS components or MEMS microphones obtained with the present concept can be adapted to customers' system requirements extremely simply. Furthermore, further features, such as e.g. waterproofness, etc., can be offered without high process complexity. Furthermore, correspondingly configured double-membrane MEMS components or MEMS microphones can be read differentially and simultaneously have sufficient protection from the surroundings, e.g. particle protection.

Additional exemplary embodiments and aspects of the invention are described which can be used individually or in combination with the features and functionalities described herein.

In accordance with a first aspect, a production method 100 for a double-membrane MEMS component 300 can comprise the following steps: providing 120 a layer arrangement 200 on a carrier substrate 210, wherein the layer arrangement 200 has a first and second membrane structure 220, 230 spaced apart from one another and a counterelectrode structure 240 arranged therebetween, wherein a sacrificial material 250 is arranged in an intermediate region 260 between the counterelectrode structure 240 and the first and second membrane structures 220, 230 respectively spaced apart therefrom, and wherein the first membrane structure 220 has an opening structure 270 to the intermediate region 260 with the sacrificial material 250, and partly removing 140 the sacrificial material 250 from the intermediate region 260 in order to obtain a mechanical connection structure 280 comprising the sacrificial material 250 between the first and second membrane structures 220, 230, which mechanical connection structure is mechanically coupled between the first and second membrane structures 220, 230 and is mechanically decoupled from the counterelectrode structure 240.

In accordance with a second aspect referring to the first aspect, in the production method 100 the step of partly removing 140 can be carried out by means of a process of anisotropically etching the sacrificial material.

In accordance with a third aspect referring to the first aspect, in the production method 100 the opening structure 270 in the first membrane structure 220 can be configured geometrically so as to obtain, during the step of partly removing 140 the sacrificial material, a single, columnar, mechanical connection element 280 comprising the sacrificial material 250 or a plurality of columnar, mechanical connection elements 280-n comprising the sacrificial material 250 between the first and second membrane structures 220, 230.

In accordance with a fourth aspect referring to the first aspect, in the production method 100 the second membrane structure 230 furthermore can have an opening structure 272, wherein the opening structures 270, 272 in the first and second membrane structures 220, 230 are configured so as to obtain, during the step of partly removing 140 the sacrificial material 250, a single, columnar, mechanical connection element 280 comprising the sacrificial material or a plurality of columnar, mechanical connection elements 280-n comprising the sacrificial material between the first and second membrane structures 220, 230.

In accordance with a fifth aspect referring to the first aspect, in the production method 100 the opening structure 270; 270, 272 in the first membrane structure 220 or in the first and second membrane structures 220, 230 can be configured so as to form the mechanical connection structure 280; 280-n comprising the sacrificial material on the basis of the etching rate and etching selectivity of the etchant for the sacrificial material 250 during the etching process, such that the connection structure 280 is mechanically coupled between the first and second membrane structures 220, 230 and mechanically decoupled from the counterelectrode structure 240.

In accordance with a sixth aspect referring to the fifth aspect, in the production method 100 the opening structure 270, 272 in the first and/or second membrane structure 220, 230 can have individual openings 270-n, 272-n on a circular line.

In accordance with a seventh aspect referring to the sixth aspect, in the production method 100 the individual openings 270-n, 272-n can be arranged symmetrically around a geometric midpoint M of the first and/or second membrane structure 220, 230.

In accordance with an eighth aspect referring to the fifth aspect, in the production method 100 the opening structure 270, 272 can have a multiplicity of distributed individual openings 270-n, 272-n in the first and/or second membrane structure 220, 230, wherein a region having a greater distance between the distributed individual openings is provided in order to predefine a position of a connection element 280.

In accordance with a ninth aspect referring to the eighth aspect, in the production method 100 a plurality of regions having a greater distance between the distributed individual openings 270-n, 272-n can be provided in order to predefine positions for the plurality of connection elements 280-n.

In accordance with a tenth aspect referring to the first aspect, in the production method 100 before the step 120 of providing the layer arrangement the following steps can be carried out: forming the second membrane structure in a patterned manner 111 on the carrier substrate in the form of a second membrane layer or a second membrane layer stack, applying 113 sacrificial material on the second membrane structure, forming the counterelectrode structure in a patterned manner 115 in the form of a counterelectrode layer or a counterelectrode layer stack on the applied sacrificial material, applying 117 sacrificial material on the counterelectrode structure, forming 119 the first membrane structure in a patterned manner on the sacrificial material in the form of a first membrane layer or a first membrane layer stack.

In accordance with an eleventh aspect, a production method 150 for a double-membrane MEMS component can comprise the following steps: providing a layer structure arrangement on a semiconductor substrate, wherein the layer arrangement has a first and second membrane structure spaced apart from one another and a counterelectrode structure arranged therebetween, wherein a sacrificial material is arranged in an intermediate region between the counterelectrode structure and the first and second membrane structures respectively spaced apart therefrom, wherein in the sacrificial material there is formed a mechanical connection structure having at least one columnar, mechanical connection element which is arranged between the first and second membrane structures and in a manner separated from the counterelectrode structure and comprises a filling material different than the sacrificial material, and wherein the first membrane structure has an opening structure to the intermediate region with the sacrificial material, and removing the sacrificial material from the intermediate region in order to expose the at least one columnar, mechanical connection element between the first and second membrane structures, which is mechanically coupled between the first and second membrane structures and is mechanically decoupled from the counterelectrode structure.

In accordance with a twelfth aspect referring to the eleventh aspect, in the production method 150 the step of removing the sacrificial material can be carried out by means of an anisotropic etching process using an etchant, wherein the etchant has an etching rate that is considerably higher for the sacrificial material than for the filling material.

In accordance with a thirteenth aspect referring to the eleventh aspect, in the production method 150 before the step of providing the layer arrangement the following steps can be carried out: forming the second membrane structure in a patterned manner in the form of a second membrane layer or a second membrane layer stack on the carrier substrate, applying sacrificial material on the second membrane structure, forming the counterelectrode structure in a patterned manner in the form of a counterelectrode layer or a counterelectrode layer stack on the applied sacrificial material, applying sacrificial material on the counterelectrode structure, introducing at least one columnar through opening into the sacrificial material as far as the first membrane structure, filling the at least one columnar through opening with the filling material in order to obtain the mechanical connection structure, and forming the first membrane structure in a patterned manner in the form of a membrane layer or a membrane layer stack on the sacrificial material and the filling material.

In accordance with a fourteenth aspect referring to the thirteenth aspect, in the production method 150 the introducing step involves introducing a plurality of columnar through openings into the sacrificial material, said plurality being formed through the sacrificial material as far as the first membrane layer or the first membrane layer stack, wherein the filling step furthermore involves filling the plurality of columnar through openings with the filling material, and wherein the step of removing the sacrificial material from the intermediate region involves obtaining a plurality of mechanical connection elements between the first and second membrane structures, wherein the plurality of mechanical connection elements is mechanically coupled between the first and second membrane structures and mechanically decoupled from the counterelectrode structure.

In accordance with a fifteenth aspect, a double-membrane MEMS component 300 can comprise the following features: a layer arrangement 200 on a carrier substrate 210, wherein the layer arrangement 200 has a first and second membrane structure 220, 230 spaced apart from one another and a counterelectrode structure 240 arranged therebetween, and a mechanical connection structure 280 comprising a sacrificial material 250 between the first and second membrane structures 220, 230, which mechanical connection structure is mechanically coupled between the first and second membrane structures 220, 230 and mechanically decoupled from the counterelectrode structure 240.

In accordance with a sixteenth aspect referring to the fifteenth aspect, in the double-membrane MEMS component 300 the mechanical connection structure 280 comprising the sacrificial material 250 can have a single columnar mechanical connection element 280 or a plurality of columnar mechanical connection elements 280-n.

In accordance with a seventeenth aspect referring to the fifteenth aspect, the double-membrane MEMS component 300 can be produced by the method 100 in accordance with the first aspect.

Although some aspects have been described in connection with a device, it goes without saying that these aspects also constitute a description of the corresponding method, such that a block or a component of a device should also be understood as a corresponding method step or as a feature of a method step. Analogously thereto, aspects that have been described in connection with or as a method step also constitute a description of a corresponding block or detail or feature of a corresponding device.

The exemplary embodiments described above merely represent an illustration of the principles of the present invention. It goes without saying that modifications and variations of the arrangements and details described herein will be apparent to others skilled in the art. Therefore, the intention is for the invention to be restricted only by the scope of protection of the following patent claims and not by the specific details that have been presented on the basis of the description and the explanation of the exemplary embodiments herein.

What is claimed is:

1. A double-membrane MEMS component, comprising:
   a layer arrangement on a carrier substrate, wherein the layer arrangement has a first and second membrane structure spaced apart from one another by a first remnant of a sacrificial material layer and a counterelectrode structure arranged therebetween; and
   a mechanical connection structure comprising a second remnant of the sacrificial material layer between the first and second membrane structures, which mechanical connection structure is mechanically coupled between the first and second membrane structures and mechanically decoupled from the counterelectrode structure,
   wherein the sacrificial material layer and the counterelectrode structure comprise different materials, and wherein the counterelectrode structure comprises a counterelectrode structure element partially embedded in the first remnant of the sacrificial material layer, and wherein the double-membrane MEMS component comprises (N+1) openings in the first membrane structure and N columnar mechanical connection elements in a cross-sectional view, wherein N is an integer.

2. The double-membrane MEMS component as claimed in claim 1, wherein the mechanical connection structure comprising the second remnant of the sacrificial material layer comprises at least one columnar mechanical connection element.

3. The double-membrane MEMS component as claimed in claim 2, wherein the at least one columnar mechanical connection element comprises a substantially cylindrical shape.

4. The double-membrane MEMS component as claimed in claim 2, wherein the at least one columnar mechanical connection element comprises a substantially frustoconical shape.

5. The double-membrane MEMS component as claimed in claim 2, wherein the at least one columnar mechanical connection element comprises a tapering concave outer contour.

6. The double-membrane MEMS component as claimed in claim 2, wherein the at least one columnar mechanical connection element comprises a barrel shape.

7. The double-membrane MEMS component as claimed in claim 2, wherein the at least one columnar mechanical connection element comprises a vertically symmetrical shape.

8. The double-membrane MEMS component as claimed in claim 1, further comprising a one-to-one relationship between a total number of openings in the counterelectrode structure and a total number of columnar mechanical connection elements in a cross-sectional view.

9. The double-membrane MEMS component as claimed in claim 1, further comprising (N+1) openings in the second membrane structure and N columnar mechanical connection elements in a cross-sectional view, wherein N is an integer.

10. A double-membrane MEMS component, comprising:
a layer arrangement on a carrier substrate, wherein the layer arrangement has a first and second membrane structure spaced apart from one another by a first material and a counterelectrode structure arranged therebetween; and
a mechanical connection structure comprising a second material between the first and second membrane structures, which mechanical connection structure is mechanically coupled between the first and second membrane structures and mechanically decoupled from the counterelectrode structure, wherein the first material is different from the second material,
wherein the first material and the counterelectrode structure comprise different materials, and wherein the counterelectrode structure comprises a counterelectrode structure element partially embedded in the first material, and wherein the double-membrane MEMS component comprises (N+1) openings in the first membrane structure and N columnar mechanical connection elements in a cross-sectional view, wherein N is an integer.

11. The double-membrane MEMS component as claimed in claim 10, wherein the first material comprises a remnant of a sacrificial layer.

12. The double-membrane MEMS component as claimed in claim 11, wherein the remnant of the sacrificial layer comprises a first portion coupled to a first end of the first membrane and to a first end of the second membrane, and a second portion coupled to a second end of the first membrane and to a second end of the second membrane.

13. The double-membrane MEMS component as claimed in claim 10, wherein the first material comprises silicon oxide, and the second material comprises a nitride material.

14. The double-membrane MEMS component as claimed in claim 10, wherein the mechanical connection structure comprises at least one columnar mechanical connection element.

15. The double-membrane MEMS component as claimed in claim 14, wherein the at least one columnar mechanical connect element comprises a substantially cylindrical shape.

16. A double-membrane MEMS component, comprising:
a layer arrangement on a carrier substrate, wherein the layer arrangement has a first and second membrane structure vertically spaced apart from one another by a remnant of a sacrificial material layer and a counterelectrode structure arranged therebetween; and
a mechanical connection structure between the first and second membrane structures, wherein the mechanical connection structure is mechanically coupled between the first and second membrane structures and mechanically decoupled from the counterelectrode structure, and wherein the mechanical connection structure comprises a single columnar mechanical connection element horizontally offset from a center of the layer arrangement,
wherein the sacrificial material layer and the counterelectrode structure comprise different materials, and wherein the counterelectrode structure comprises a counterelectrode structure element partially embedded in the remnant of the sacrificial material layer, and wherein the double-membrane MEMS component comprises (N+1) openings in the first membrane structure and N columnar mechanical connection elements in a cross-sectional view, wherein N is an integer.

17. The double-membrane MEMS component as claimed in claim 16, wherein the single columnar mechanical connection element comprises a substantially cylindrical shape.

18. The double-membrane MEMS component as claimed in claim 16, wherein the single columnar mechanical connection element comprises at least a portion having a substantially frustoconical shape.

19. The double-membrane MEMS component as claimed in claim 16, wherein the single columnar mechanical connection element comprises silicon dioxide or a nitride material.

* * * * *